United States Patent [19]

Appelt et al.

[11] Patent Number: 4,969,979

[45] Date of Patent: Nov. 13, 1990

[54] DIRECT ELECTROPLATING OF THROUGH HOLES

[75] Inventors: Bernd K. Appelt, Apalachin; Perminder Bindra; Robert D. Edwards, both of Vestal; James R. Loomis; Jae M. Park, both of Binghamton; Jonathan D. Reid, Johnson City; Lisa J. Smith, Maine; James R. White, Owego, all of N.Y.

[73] Assignee: International Business Machines Corporation, Armonk, N.Y.

[21] Appl. No.: 348,844

[22] Filed: May 8, 1989

[51] Int. Cl.⁵ .................... C25D 5/02; C25D 5/04
[52] U.S. Cl. .................... 204/15; 204/20; 204/26
[58] Field of Search ................ 204/15, 20, 26

[56] References Cited

U.S. PATENT DOCUMENTS

| | | | |
|---|---|---|---|
| 2,243,429 | 5/1941 | Leipzig | 204/30 |
| 2,897,409 | 7/1959 | Gitto | 317/101 |
| 3,099,608 | 7/1963 | Radovsky et al. | 204/15 |
| 3,163,588 | 12/1964 | Shortt et al. | 264/16 |
| 3,267,007 | 8/1966 | Sloan | 204/15 |
| 3,619,382 | 11/1971 | Lupinsky | 204/15 |
| 3,775,176 | 11/1973 | Cross et al. | 117/227 |
| 4,090,984 | 5/1978 | Lin et al. | 252/511 |
| 4,181,582 | 1/1980 | Dahms | 204/52 |
| 4,193,849 | 3/1980 | Sato | 204/38 |
| 4,325,780 | 4/1982 | Schulz | 156/659 |
| 4,454,168 | 5/1984 | Fritz | 427/96 |
| 4,478,883 | 10/1984 | Bupp et al. | 427/97 |
| 4,554,182 | 11/1985 | Bupp et al. | 427/304 |
| 4,581,301 | 4/1986 | Michaelson | 428/551 |
| 4,622,108 | 11/1986 | Polakovic et al. | 204/15 |
| 4,634,619 | 1/1987 | Lindsay | 427/97 |
| 4,683,036 | 7/1987 | Morrissey et al. | 204/15 |
| 4,691,091 | 9/1987 | Lyons et al. | 219/121 |
| 4,701,350 | 10/1987 | Lindsay | 427/97 |
| 4,718,993 | 1/1988 | Cupta et al. | 204/15 |
| 4,724,005 | 2/1988 | Minten et al. | 106/307 |
| 4,735,676 | 4/1988 | Iwasa | 156/630 |
| 4,783,243 | 11/1988 | Ando et al. | 428/458 |
| 4,790,912 | 12/1988 | Holtzman et al. | 204/15 |
| 4,806,159 | 2/1989 | Keyser et al. | 106/111 |
| 4,874,477 | 10/1989 | Pendleton | 204/15 |

FOREIGN PATENT DOCUMENTS 58-12392  1/1983  Japan .

OTHER PUBLICATIONS

Circuits Manufacturing, Jan., 1987, pp. 20–23, "Dump Electroless", by Rudolph Zeblisky, Kollmorgen Corp.
Colloidal Systems and Interfaces, pp. 363–364, John Wiley & Sons, 1988.
Condensed Chemical Dictionary, 11th Ed., pp. 218–219.

Primary Examiner—T. M. Tufariello
Attorney, Agent, or Firm—Judith D. Olsen

[57] ABSTRACT

Substantially nonconductive or semiconductive surfaces of through holes can be electroplated directly, without an intervening non-electrolytic metallization, by a stepwise process which includes the application to the through holes of a polyelectrolyte surfactant in solution in combination with the application of a conductive metal containing material.

18 Claims, 2 Drawing Sheets

DIRECT ELECTROPLATING OF THROUGH HOLES

DESCRIPTION

1. Technical Field

This invention relates to a process for preparing an electrically nonconductive substrate for electroplating.

More particularly, this invention relates to a process for preparing the through holes of a metal clad dielectric laminate for direct electroplating.

2. Background Art

The use of metal clad dielectric laminates as printed circuit boards is well known. Metal clad dielectric laminates as used for printed circuit boards may comprise one or more than one nonconductive layer alternated with a conductive metallic layer laminated thereto. In order to create conductive pathways on the surfaces of the dielectric, one or more of the conductive metallic layers may be chemically etched, leaving behind lines protected by photoresist left behind after photoresist exposure and development, as in subtractive processing, or an unclad dielectric may be plated up in line patterns into lines which have been exposed and developed within a positive photoresist, as in additive processing, or otherwise shaped. A number of these metal clad, or patterned, laminates can be combined by heat and pressure to form a multiple laminate. Often it is necessary or desirable in a printed circuit board to make electrical connection between one or more of the metallic layers. This object may be accomplished, for example, by creating electrically conductive pathways in holes that extend through the entire structure to connect outer metallic layers to each other, or that extend only partially through the structure from an outside metallic layer to any internal metallic layer. Though the latter holes are often referred to as vias, blind vias or viaducts, for the purposes of this disclosure the term "through holes" may be used to represent any or all such types of pathways.

In wet processing of printed circuit boards, through holes are drilled, cleaned of drilling residue ("desmeared") such as by exposure to chomic-sulfuric acid solution or hot alkaline cleaner, sensitized and activated in a one or two step tin/palladium or other catalytic treatment for subsequent electroless plating. Electroless plating is known and there are a number of baths and systems commercially available. Electroless deposition of a metal onto a nonconductor is initiated on the sensitized and activated surface, and maintained by the action of a reducing agent in the plating bath rather than by electrolytic reduction. The term electroless has also been used where the deposition of a more noble metal onto a less noble metal is the result of an exchange reaction, or electrochemical displacement reaction, based on the relative positions of the metals in the electromotive series, or indeed in reference to any nonelectrolytic wet plating method.

Although in wide use, electroless solutions are often difficult to control, deposit at a slow rate and give rise to possible environmental concerns if not carefully scrutinized. In the case of electroless deposition of copper, a typical bath may contain such materials as a formaldehyde reducing agent and an ethylenediaminetetracetate complex, with brighteners and stress reducers, any of which may present disposal or regeneration problems, may require special handling and equipment, and may require special safety precautions for workers. Monitoring of concentration of the various bath constituents and process parameters is complex but necessary for reproducibility of results and to avoid spontaneous, uncontrolled decomposition of the electroless plating bath. Use of electroless deposition also introduces a number of additional expensive process steps and intermediate rinses to the completion of a printed circuit board.

Since electroless deposition is relatively slow, it is normally used on the printed circuit board only to produce a electrically continuous surface to support a subsequent build-up of deposit thickness by the much faster process of electroplating.

Electroless plating into through holes, and subsequent electroplating thereof, present the additional problems of penetration of the bath throughout the hole and avoidance of adhesion of bubbles to the walls of the holes, with resultant plating voids and discontinuities. Adhesion of electroless deposits to nonconductors is an ongoing problem and is still being investigated, although many suggestions for obtaining improved adhesion of metals to printed circuit boards and through holes can be found in the art.

Electroplating without going through the conventional electroless steps has been investigated in the art also.

U.S. Pat. No. 4,581,301, issued to Michaelson on Apr. 8, 1986, is directed to producing a conductive pattern on predefined regions of the surfaces of a substrate. Only those predetermined regions and the through hole walls are coated with a seed layer comprising conductive particles and a binder, then electroplated. The binder is further identified as a resin adhesive, which is to be cured at an elevated temperature, and throughout which conductive particles are uniformly distributed. This mixture is applied into the holes by silk screening.

Application of resin coating in solution to a non-conductor by silk screening, roll coating and the like, partial heat curing of the resin, then vacuum or electroless metallizing with final heat cure in vacuum is described in U.S. Pat. No. 3,267,007, issued Aug. 16, 1966 to Sloan, as a means of improving the adhesion of the metal to the resin. Through holes in the Sloan patent are subjected to the same treatment as an incident of the treatment of the rest of the structure.

In U.S. Pat. No. 2,897,409 to Gitto issued July 28, 1959 it was described that "the use of graphite for producing a conductive base surface on the exposed areas of the holes punched in the baseboards results in an extremely deficient product . . . since it migrates a substantial distance into the insulating member during electrodeposition . . . ", resulting in a faulty bond with the plated metal and the resin. Therefore, rather than carbon Gitto uses copper preferably, or iron, zinc, nickel or aluminum particles in a non-diffusible metal particle layer "about the exposed area of holes" applied in a volatile solvent and lacquer mixture and air dried. The mesh size of the particles is critical, and any excess is wiped off by cloth. The holes thus prepared are electroplated directly.

U.S. Pat. No. 3,775,176, issued to Cross et al Nov. 27, 1973, describes electrodeposition onto a formerly nonconductive substrate after applying a thermoplastic organic polymer layer of about 0.1–2.0 mils in which is dispersed at least about 25 volume percent of 1–10 micron metallic particles in a microporous structure, at least 1 micron deep to about 10 microns. However, Cross also teaches that the electroplate will adhere more strongly if there is a "chemical displacement type preplate" before electroplating. (See col. 2, lines 9–36) This patent is not particularly directed to treatment of through holes in circuit boards, but to the surfaces of non-conductive substrates. As seen in Example 3 of the Cross patent, the porosity of the organic precoat is a key element in obtaining good adhesion.

U.S. Pat. No. 4,454,168, issued to Fritz June 12, 1984, describes making conductive circuits by applying fluidized particulate metal into "tacky" image areas and vias, providing a displacement reaction and electrodepositing metal. The "tacky" and "nontacky" resin image areas are critical to the invention. (See col. 2, lines 14–16). Heat treating, or mechanically impressing the particles prior to displacement enhances adhesion of the electrodeposited metal layer.

U.S. Pat. No. 3,619,382, issued to Lupinski Nov. 9, 1971, describes the dispersion in an elastomeric binder containing oxide or hydroxide of cadmium, indium, lead or zinc, which are electrochemically reduced to metal using a brush contact cathode for subsequent electroplating of surfaces including the internal surface of a tube.

U.S. Pat. No. 4,193,849, issued to Sato Mar. 15, 1978, is directed to vapor deposited metal as a base for the subsequent electroplating of a printed circuit board.

U.S. Pat. No. 4,325,780, issued to Schulz Apr. 20, 1982, describes a conventional subtractive wet processing means of metallizing through holes using a process which includes an electroless plating step prior to electroplating.

U.S. Pat. No. 4,735,676, issued to Iwasa Apr. 5, 1988, is directed to the use of a copper metal paste to provide circuitry on a printed circuit board. The paste is comprised of 80%–85% copper powder and 15%–20% synthetic resin, optionally including carbon, and is used to build up multiple laminations and cured ("heated to harden"). The paste is not intended to replace activation and electroless plating within a through hole.

U.S. Pat. No. 4,691,091, issued to Lyons et al Sept. 1, 1987, mentions the use of a moving laser beam to produce electrically conductive carbon paths on a polymeric substrate, e.g. circuit board, by thermal decomposition of the material long the path of the laser. Direct electroplating of the carbon pathways is then possible. The presence of filler in the polymer can affect laser absorption. Treatment of through holes is not part of this process.

Japanese PUPA 58-12392 published Jan. 24, 1983 by Muramatsu also mentions making non-conductive polymers conductive along paths using laser scanning. The presence of some silver and copper particles within the resin enhances the result. However, the amount of metal dopant permitted is limited by the necessity to have the polymer function as an insulator.

U.S. Pat. No. 4,718,993 issued to Cupta et al Jan. 12, 1988 describes a process for direct electroplating of through holes and printed wiring boards which includes contacting with an aqueous alkaline silicate solution, contacting with a carbon black dispersed in surfactant, removing the liquid portion of the carbon dispersion, and electroplating.

U.S. Pat. No. 4,724,005 issued to Minten et al Feb. 9, 1988 describes direct electroplating of a surface which has been treated with a carbon dispersion in surfactant solution, solvent being removed.

U.S. Pat. No. 4,622,108 issued to Polakovic et al Nov. 11, 1986, an improvement patent over U.S. Pat. No. 4,724,005, describes the additional step of applying a preconditioning solution comprising an aqueous solution of alkaline hydroxide in the preferred embodiment comprising also ethylene glycol and monoethanolamine, among other acceptable surfactants.

U.S. Pat. No. 4,783,243 issued to Ando et al Nov. 8, 1988 mentions the rendering of a polymeric substrate sufficiently electrically conductive for direct electroplating by impregnation of the substrate with metallic sulfide, e.g. copper sulfide in polyamide. This patent appears to be inapplicable to the fabrication of laminated circuit boards having through holes, as not only the surfaces would be electrically conductive, but the dielectric properties of the polymeric substrate would be adversely affected.

U.S. Pat. No. 4,790,912 issued to Holtzman et al on Dec. 13, 1988 mentions direct electroplating on the surfaces of a circuit board patterned with photoresist, including the through holes, by electrolytic generation of hydrogen at a catalyst surface from a protic bath, followed by electrodeposition of metal from the same bath as the hydrogen. The efficacious combination of the hydrogen with the catalyst is enhanced by the presence of "promoters" such as surfactants, on the substrate prior to metal electrodeposition.

Despite the foregoing material, electroless processing remains a conventional procedure in the processing of printed circuit boards and the metallization of the walls of through holes.

U.S. Pat. No. 4,554,182 issued Nov. 19, 1985 to Bupp et al describes the use of a "multifunctional cationic copolymer" as a precursor to electroless plating. Two of the polyelectrolytes described in the examples in the present invention for direct electroplating are such copolymers.

U.S. Pat. Nos. 4,634,619 and 4,701,350 issued to Lindsay Jan. 6, 1987 and Oct. 20, 1987, respectively, also mention the use of polyelectrolytes in pretreatment of nonconductors prior to electroless deposition.

SUMMARY OF THE INVENTION

The present invention has been provided to eliminate certain disadvantages of the prior art. It is therefore an object of the invention to provide through hole wet processing of laminates without the use of an electroless or other non-electrolytic process step and without a curing step.

It is a further object of the invention to reduce process time and simplify the procedure of processing through holes.

It is a further object of the invention to provide a surface within a through hole which is capable of being directly electroplated with metal.

It is a further object of the invention to provide a means of consistently obtaining a strongly adherent, substantially flaw-free electrodeposit within any through hole of a printed circuit board through the application of a dilute cationic or anionic surfactant in water, such as a polyelectrolyte, to the walls of the through hole, adsorbing a charged metal-containing specie to the polyelectrolyte, and electroplating.

A polyelectrolyte is a particular type of surface active agent. It is a multiply charged, high molecular weight substance which has found use in the water treatment industry as a flocculant. It has also been used as a surface treatment for electroless deposition (see the patents to Lindsay and Bupp referenced above).

The process of the invention applies to the preparation for direct electroplating of metal within the through holes and vias which extend into or through laminated printed circuit boards. The adhesion and quality of the resulting deposit are reproducibly excellent, and the throwing power surprisingly improved.

A dielectric (e.g. a drilled hole in an epoxy glass printed circuit board) is seeded by first conditioning the surface with a surfactant or polyelectrolyte followed by a variety of methods for incorporating either a noble or non-noble metal complex, salt or colloid any of which must be converted to their electronically conducting form. The resultant film or seed layer comprises an electronically conducting metal nested in an ionically conducting polyelectrolyte/surfactant network. As the copper surfaces on the PCB are made cathodic for electrolytic plating, the plated copper migrates from the copper foil across the seed layer by a percolation mechanism. The film produced by the polyelectrolyte/surfactant provides an ionically conductive network and the seed metal provides electronically conductive sites at which the plated metal may nucleate. By virtue of the large number of nucleation sites the electroplated metal propagates rapidly across the seed layer providing uniform coverage.

Accordingly, the present invention succeeds in the following manner:

1. Providing a printed circuit board of at least one nonconductive layer, laminated on either or both sides with a conductive metal layer and defining at least one through hole extending at least partially therethrough.
2. Exposing the through holes to a dilute solution of either cationic or anionic polyelectrolyte/surfactant, then rinsing.
3. Contacting the polyelectrolyte/surfactant with a colloidal suspension or solution of material which is adsorbed onto the polyelectrolyte macromolecule and chemically treated as necessary, such that the surface is rendered substantially electrically continuous.
4. Electroplating within the holes to desired thickness.

The product resulting from the above process is comprised of a cured resinous material positioned in sandwich fashion between conductive metal layers which may or may not be patterned, at least two metal layers being electrically connected by at least one conductive through hole. It will be obvious to one skilled in the art that this product and process can also be used to render conductive through holes connecting any of a number of like layers laminated together to either of the two external conductive layers.

DETAILED DESCRIPTION

Figure 1:
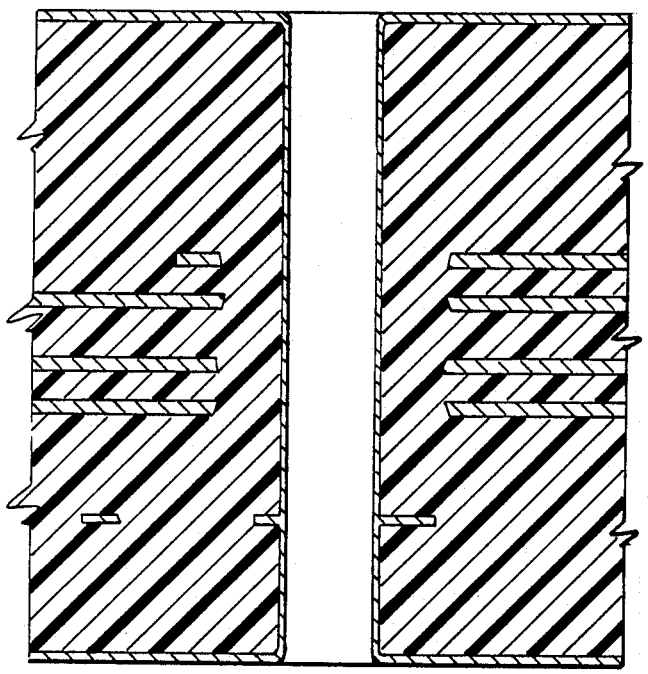
FIG. 1 is a plated through hole treated by the process of Example 1 and electroplated at 15 amps ft$^2$ (ASF) for a time sufficient to produce 1.6 mils of copper on the surface and 1.02 mils ±0.17 in the center region of the through hole. Throwing power is equal to about 64 percent. The light regions represent copper.
Figure 2:
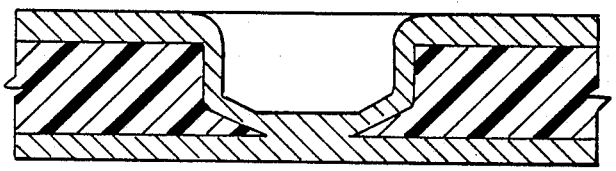
FIG. 2 is a blind via treated by the process of Example 1 and electroplated at 65 ASF.
Figure 3:
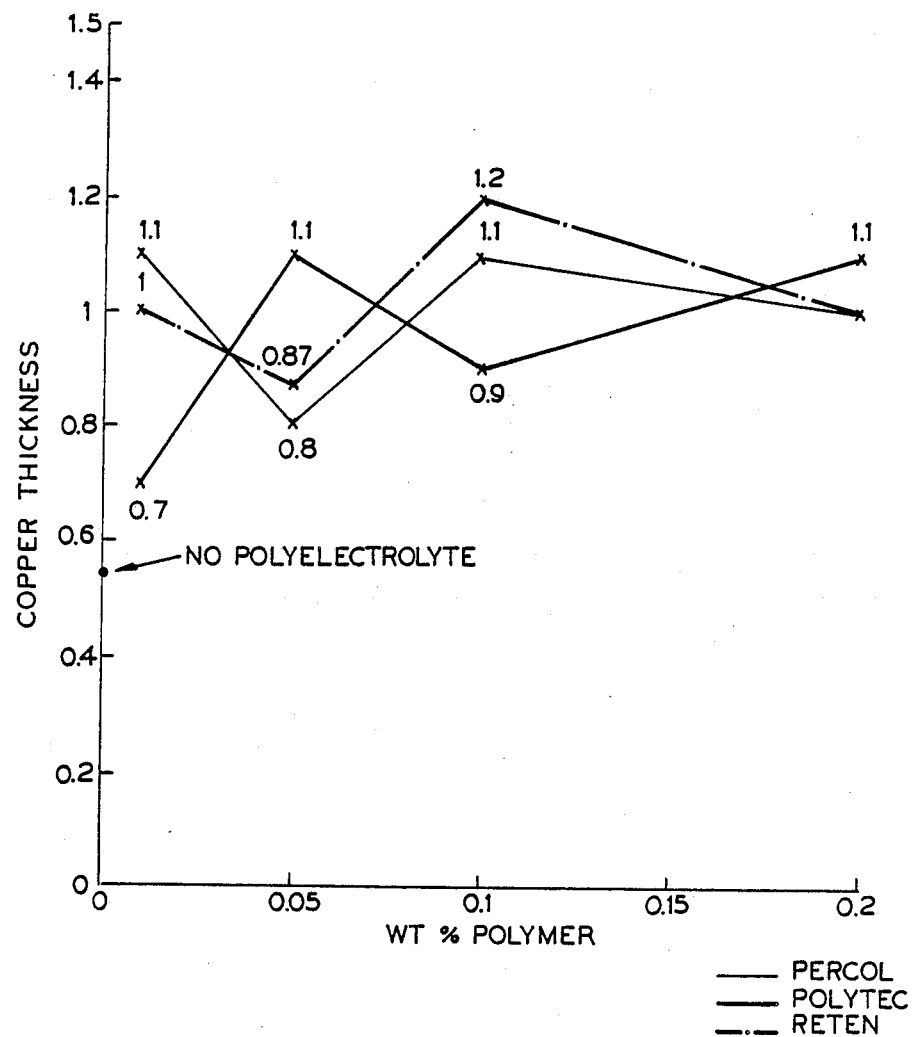
FIG. 3 represents a graph showing copper thickness v. polyelectrolyte weight percent in the pretreatment solution. This Figure shows that the use of polyelectrolyte improves the throwing power of copper deposition on the walls of the through holes. Although the concentrations of the three polyelectrolyte solutions are expressed in weight percent rather than molarity, the Figure shows that the process is not directly proportional to concentration of polyelectrolyte in solution, beyond a minimum. The copper thickness values were obtained at the center of representative through holes.

The present invention is directed toward preparing through holes in dielectric layers, particularly those connecting an external conductive layer with at least one other conductive layer in a laminated printed circuit board. The preparation entails the use of anionic or cationic polyelectrolyte or other surfactant solutions which are contacted with the walls of the through holes, adsorption of conductive material or materials at the surface of the polyelectrolyte macromolecule and electroplating the through holes.

Those skilled in the art will see that any metal capable of being electroplated from solution compatible with the dielectric material can be deposited in the process of this invention such as nickel, gold, palladium, silver, preferably copper and any alloys of these metals capable of being electrically codeposited. Appropriate baths are available from a number of suppliers.

Likewise it would be clear to one skilled in the art that the process of the invention and resulting product can be employed to prepare through holes in any of the dielectric materials normally considered suitable for comprising printed circuit boards or cards, such as filled epoxies or polyimides, e.g. Kapton (a registered trademark of E. I. DuPont de Nemours and Co., Inc.) or Teflon (a registered trademark of E. I. DuPont de Nemours and Co., Inc.) or filled Teflon materials, and within holes prepared by any suitable means, such as mechanical or laser drilling, with conventional desmearing as required.

Specifically a printed circuit board is manufactured in accordance with the preferred embodiment described herein by first drilling and desmearing any necessary through holes through a dielectric sheet, preferably clad on both surfaces with metal foil, preferably copper foil.

The polyelectrolyte or surfactant water solution is unmixed with other ingredients. The solution can be quite dilute, approximately a monolayer of polyelectrolyte or other long-chain surfactant being minimally required at the dielectric surface. It is expected that any large cationic or anionic surfactant or polyelectrolyte surfactant molecule having hydrophobic portions to connect with the dielectric and hydrophilic portions to connect with the particles which are to be conductive for electroplating would be suitable. Several types of surfactant and polyelectrolyte have been demonstrated to enable the direct electrodeposition of excellent quality, strongly adherent films onto nonconductors. One such polyelectrolyte, Reten 210, a registered trademark of Hercules, Inc. of Wilmington, Del., and another, Polytec 7M, a registered trademark of W. R. Grace and Co., supplied by Tecna Corporation of Belleville, N.J., come in powder form and comprise a copolymer of acrylamide and betamethacrlyl-oxyethyltrimethylammonium methyl sulfate, having a Brookfield viscosity in a 1% solution of 800–1200 cps. FC95 obtained from Fluorad, is a nonionic potassium perfluoroalkyl sulfonate non-polyelectrolyte surfactant and is a product of 3M, Minneapolis, Minn.

An anionic polyelectrolyte, Percol 727, a registered trademark of Allied Colloids, Ltd., comprises a sulfonate functionality with an acrylic acid backbone. Percol 763 is similar to the Reten 210 and Polytec 7M, and is cationic.

The processing can be stopped subsequent to any convenient step in the process and the substrate dried and stored for resumption of processing.

The following representative examples are presented to define the invention more fully only and are not intended as limitations. All percentages are by weight unless otherwise noted, and all through holes were subjected to desmearing prior to step 1.

EXAMPLE 1—Colloidal Pd/Sn and Cationic Polyelectrolyte

A glass filled, epoxy impregnated printed circuit board (PCB), having at least one hole extending therethrough and having two major surfaces, on each of which was laminated copper cladding, was subjected to the following process: (The numbers in parentheses represent approximate ranges of acceptable times, temperatures or concentrations.)

| Step | Process | Time (Min.) | Temp. (°C.) | Concentration |
|---|---|---|---|---|
| 1. | *K2 Alkaline Cleaner | 5 (3–7) | 60 (50–70) | As Is |
| 2. | Deionized Water (D.I.) Rinse | 1 | 60 | |
| 3. | D.I. Rinse | 1 | Room Temp. (RT) | |
| 4. | Reten 210 | 2 (1–3) | RT | 0.05% (0.001–0.1) |
| 5. | D.I. Rinse | 2 | RT | |
| 6. | **Pd/Sn Seed | 3 (1–5) | RT | |
| 7. | D.I. Rinse | 2 | RT | |
| 8. | Sulfuric Acid Dip | 1.5 | RT | 10% solution (8–15) |
| 9. | ***Acid Copper Electroplate @ 15–65 ASF for a time sufficient to obtain the desired thickness. | | | |

*K2 is a product of Pennwalt Corp., Philadelphia, PA. It is beleived to contain sodium metasilicate and sodium lauryl sulfate in a sodium hydroxide solution.
**A composition and a method of making Pd/Sn seed is described in U. S. Pat. No. 4,478,883.
***A acid copper electroplate which is preferably used here is obtained from Chemcut, and is called Cupracid. It is made up to contain cupric sulfate in a sulfuric acid solution, with small amounts of chloride ion, brightener and leveller. Any commercially available acid electroplating copper bath is usable in this step. It would be clear to one of ordinary skill in the art that the electroplating bath need not be limited to a copper electroplating bath.

EXAMPLE 2—Cationic

The same process was followed on a second board as in Example 1, except that in Example 2 a sodium persulfate microetch was performed between Step #5 and Step #6 as follows:
5a. Sodium Persulfate solution in an amount of 100 g/l (80–120) in 1%/vol. sulfuric acid, for 1.5 min. at RT.
5b. D.I. Water Rinse for 2 min. at RT.

The persulfate etch penetrates the polyelectrolyte to microetch the copper surface, while leaving the polyelectrolyte intact on the dielectric portion of the through hole.

EXAMPLE 3—Cationic

The same process was followed on a third board as in Example 1, except that in Example 3 the polyelectrolyte Polytec 7M was substituted for the Reten 210.

EXAMPLE 4—Cationic

The same process was followed on a fourth board as in Example 2, except that in Example 4 Polytec 7M was substituted for the Reten 210.

EXAMPLE 5—Cationic

The same process was followed on a fifth board as in Example 1, except that in Example 5 Percol 763 was substituted for the Reten 210.

EXAMPLE 6—Cationic

The same process was followed on a sixth board as in Example 2, except that in Example 6 Percol 763 was substituted for the Reten 210.

EXAMPLE 7—Anionic

The same process was followed on a seventh board as in Example 1, except that in Example 7 Percol 727 was substituted for the Reten 210.

EXAMPLE 8—Anionic

The same process was followed on an eighth board as in Example 2, except that in Example 8 Percol 727 was substituted for the Reten 210.

EXAMPLE 9—No Polyelectrolyte

The same process was followed on an ninth board as in Example 1, except that in Example 9 Steps 4 and 5, the polyelectrolyte dip and rinse steps, were omitted.

EXAMPLE 10—No Polyelectrolyte

The same process was followed on a tenth board as in Example 2, except in Example 10 Steps 4 and 5, the polyelectrolyte dip and rinse steps, were omitted.

Examples 1-8 were all similar in terms of throwing power. (Throwing power is an expression used in electroplating to describe the ability of a bath to yield a uniform deposit even within recesses and on irregular shapes as compared to flat exposed surfaces.) Examples 9 and 10 were less satisfactory, giving approximately 40% less throwing power. Throwing power (in %)=(metal thickness at center of through-hole/metal thickness at upper end of through-hole) ×100.

EXAMPLE 11—Drying

The same process was followed on the eleventh board as shown in Example 1, except the board was dried between Step 7 and Step 8, the D.I. rinse and the sulfuric acid dip steps, and stored.

This drying step would be inserted in pattern electroplating, where PCB's would come off line after seed for photoresist processing prior to Step 9, the electroplating step. The drying step was inserted after Steps 6 and 7, the seed and D.I. rinse. Note the increased time in Step 8, the sulfuric acid dip, necessary to rehydrate the seed layer:

Step 7a—Dry the board for 15 min. (10-20) at about 100° C. in a hot air blower.

Step 8—Sulfuric acid dip in a 10%/vol. solution for 15 min. (2-20) at RT.

EXAMPLE 12—Drying

The same process was followed on an twelfth board as is shown in Example 2, except that the board was dried and dipped into dilute sulfuric acid as described in Example 11.

EXAMPLE 13—Non-precious metal colloid

The same process was followed on the thirteenth board as shown in Example 1, except that a copper colloidal seed was substituted for the Pd/Sn seed of Step #6. The copper colloidal seed was used full strength, having been made up as follows:

To 500 mls of water containing 0.05% FC95 fluorocarbon surfactant, add 100 mls of a 0.53 M stannous chloride solution. Then add 20 mls of a 2 M cupric chloride solution. Then add 100 mls of a 0.4 M sodium thiosulfate solution. The mixture was heated to 45 deg. C. for about 1 hour until colloid formation occurs. The colloid may be used full strength and substituted for Pd/Sn in example 1.

EXAMPLE 14—Non-Colloidal Precious Metal

The following process was followed on a fourteenth board:

| Step | Process | Time (Min.) | Temp. | Concentration |
|---|---|---|---|---|
| 1 | Alkaline Clean | 5 | | |
| 2 | D.I. Rinse | 2 | | |
| 3 | Polytec 7M | 2 | | |
| 4 | D.I. Rinse | 2 | | |
| 5 | PdCl$_2$ Solution | 3 (1-5) | RT | 1 g/l (0.1-10) |
| 6 | D.I. Rinse | 2 | | |
| 7 | Sodium Borohydride + NaOH | 4 (1-6) | RT | 5 g/l (2-10) + 40 g/l, resp. (4-100) |
| 8 | D.I. Rinse | 2 | | |
| 9 | Sulfuric Acid Dip | | | |
| 10 | Acid Copper Electroplate | | | |

The same process flow may be used substituting other soluble salts or complexes of Pd or Pt, such as platinum chloride or palladium acetyl acetonate for the PdCl$_2$ solution of Step 5. The concentration ranges and process times for all steps would be the same.

EXAMPLE 15 the same process was followed on a fifteenth board as is shown in Example 14, except that step 5, Pdcl$_2$ solution, was replaced by a 1 g/l ruthenium chloride (RuCl$_3$) solution (0.1-10 g/l) for 3 min. (1-5 min.) and the borohydride-NaOH rinse, step 7 of Example 14, was eliminated and replaced by a 2 minute (1-5 min.) dip in 40 g/l NaOH solution in order to convert the ruthenium chloride to electronically conductive RuO$_x$, where x approximately equals 2.

EXAMPLE 16—Carbon

A palladium tin colloid was prepared as described in Example 1. To this colloid graphite powder was added (4 gm/l). A drilled PCB was processed according to Example 1 and resulted in a decrease in the throwing power. An enhancement would be expected if carbon black were substituted for graphite.

While there have been shown and described what are at present considered the preferred embodiments of the invention, it will be obvious to those skilled in the art that various changes and modifications may be made therein without departing from the scope of the invention as defined by the appended claims.

What is claimed is:

1. A method for the direct electroplating of the walls within a through hole in a metal clad dielectric laminate, without an electroless plating step, the method comprising the steps of:

providing at least one through hole in the metal clad laminate;

cleaning away any drill smear;

applying a solution of surfactant to the walls of the through hole;

rinsing away any surfactant in excess of an amount useful to attract and promote adhesion of a metal-containing material to the wall of the through hole;

applying a solution comprising metal containing material to the wall of the through hole;

rinsing away any excess conductive metal-containing material from the hole so as to leave a quantity of the material in the walls sufficient to permit electroplating; and electroplating metal to a predetermined thickness on the wall of the through hole which has been rendered conductive by the metal containing material.

2. The method as recited in claim 1 wherein the electroplated metal comprises copper.

3. The method recited in claim 1 wherein the surfactant comprises a polyelectrolyte.

4. The method recited in claim 3 wherein the metal containing material comprises a conductive colloid.

5. The method recited in claim 3 wherein the polyelectrolyte comprises a cationic polyelectrolyte.

6. The method recited in claim 3 wherein the polyelectrolyte comprises an acrylic acid backbone.

7. The method recited in claim 3 wherein the polyelectrolyte comprises a anionic polyelectrolyte.

8. The method recited in claim 3 wherein the polyelectrolyte comprises a sulfonic acid group.

9. The method recited in claim 3 wherein the polyelectrolyte comprises an amine group.

10. The method recited in claim 3 wherein the type of metal containing material comprises ruthenium III chloride converted to ruthenium IV oxide, the method including also the steps of rinsing in solution comprising alkaline earth hydroxide and water rinsing prior to electroplating.

11. The method recited in claim 3 wherein the metal containing material comprises a soluble salt of a conductive metal in solution, the method including the additional step just prior to the electroplating step of rinsing the walls of the through holes in a solution comprising a reducing agent.

12. The method recited in claim 4 wherein the Sn/Pd colloid solution also includes carbon black particles.

13. The method recited in claim 4 wherein the conductive colloid comprises Sn/Pd colloid.

14. The method recited in claim 4 wherein the conductive colloid comprises copper colloid.

15. The method recited in claim 5 wherein the polyelectrolyte comprises a copolymer of acrylamide and beta-methacryl-oxyethyltrimethylamnonium-methyl sulfate.

16. The method recited in claim 13 comprising the additional step of applying to the walls of the through holes a microetch solution containing persulfate.

17. The method recited in claim 13 comprising the additional step of drying the sidewall of the through hole after the application of the Sn/Pd colloid 18. A printed circuit board defining at least one conductive through hole therein formed by the process comprising the steps of:
providing at least one through hole within the metal clad laminate;
cleaning away any drill smear;
applying a solution of polyelectrolyte to the walls of the through hole;
rinsing away any polyelectrolyte in excess of an amount useful to attract and promote adhesion of a metal-containing material to the wall of the through hole;
applying a solution comprising metal containing material not including an electroless plating bath to the wall of the through hole;
rinsing away any excess conductive metal-containing material from the hole so as to leave a quantity of the material in the walls sufficient to permit electroplating; and
electroplating metal to a predetermined thickness on the wall of the through hole which has been rendered conductive by the metal containing material.

* * * * *